(12) United States Patent
Lee et al.

(10) Patent No.: US 8,309,995 B2
(45) Date of Patent: Nov. 13, 2012

(54) CMOS IMAGE SENSOR

(75) Inventors: Kyung-Ho Lee, Suwon-si (KR); Dong-Yoon Jang, Hwaseong-si (KR); Jung-Chak Ahn, Yongin-si (KR); Moo-Sup Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 157 days.

(21) Appl. No.: 12/820,787

(22) Filed: Jun. 22, 2010

(65) Prior Publication Data

US 2011/0018042 A1    Jan. 27, 2011

(30) Foreign Application Priority Data

Jul. 21, 2009  (KR) .................. 10-2009-0066268

(51) Int. Cl.
  *H01L 31/062* (2012.01)
  *H01L 31/113* (2006.01)

(52) U.S. Cl. .................. 257/292; 257/432; 257/E31.127

(58) Field of Classification Search .................. 257/292, 257/432, E31.127, E27.137
See application file for complete search history.

(56) References Cited

U.S. PATENT DOCUMENTS

| | | | |
|---|---|---|---|
| 7,365,298 B2 * | 4/2008 | Ryu | 250/208.1 |
| 7,517,713 B2 * | 4/2009 | Sumi | 438/57 |
| 8,119,436 B2 * | 2/2012 | Park | 438/69 |
| 2010/0110271 A1 * | 5/2010 | Yanagita et al. | 348/340 |

FOREIGN PATENT DOCUMENTS

| | | |
|---|---|---|
| JP | 2007-081015 A | 3/2007 |
| JP | 2007-311563 A | 11/2007 |
| KR | 10-0659503 A | 2/2006 |

* cited by examiner

*Primary Examiner* — Phuc Dang
(74) *Attorney, Agent, or Firm* — Harness, Dickey & Pierce, P.L.C.

(57) ABSTRACT

A unit pixel of a CMOS image sensor include a photodiode that transforms light to an electric charge, and accumulates the electric charge, and a plurality of transistors that generate an electric signal based on the accumulated electric charge. The photodiode has a slope shape based on incident angle of the light in a semiconductor substrate.

14 Claims, 10 Drawing Sheets

CMOS IMAGE SENSOR

CROSS-REFERENCE TO RELATED APPLICATION(S)

This application claims priority under 35 USC §119 to Korean Patent Application No. 2009-0066268, filed on Jul. 21, 2009, in the Korean Intellectual Property Office (KIPO), the contents of which are incorporated herein in its entirety by reference.

BACKGROUND

1. Technical Field

Example embodiments relate to an image sensor, and more particularly to a unit pixel and a CMOS image sensor having the same.

2. Description of the Related Art

An image sensor is a device that transforms light to an electric signal. In detail, the image sensor performs a sensing operation by capturing the light reflected by subjects, and by transforming the light into the electric signal. The image sensor may be divided into two types: a charged coupled device (CCD) image sensor and a complementary metal-oxide semiconductor (CMOS) image sensor.

A unit pixel of the CMOS image sensor transforms light into an electric charge to accumulate the electric charge, and transforms the accumulated electric charge to an electric signal. Generally, the CMOS image sensor employs a bayer pattern technique. However, conventional CMOS image sensor has bad spectral characteristics when the bayer pattern technique is employed.

SUMMARY

Example embodiments provide a unit pixel for a CMOS image sensor capable of preventing an optical crosstalk due to incident light.

Example embodiments provide a CMOS image sensor having the unit pixel.

According to some example embodiments, a unit pixel of a CMOS image sensor may include a photodiode that transforms light to an electric charge, and that accumulates the electric charge, and a plurality of transistors that generate an electric signal based on the accumulated electric charge. The photodiode may have a slope shape based on incident angle of the light in a semiconductor substrate.

In some embodiments, the photodiode may include a plurality of doping regions. The doping regions may be laminated in a slope direction based on the incident angle of the light.

In some embodiments, the doping regions of the photodiode in the unit pixel arranged on an edge portion of an image sensor pixel array may be laminated in a greater slope direction compared to the doping regions of the photodiode in the unit pixel arranged on a center portion of the image sensor pixel array.

In some embodiments, the doping regions may include a first through third doping regions. The second doping region may be formed above the first doping region. The third doping region may be formed above the second doping region.

In some embodiments, the first doping region may be a (n−)-type doping region. The second doping region may be a (n−)-type doping region. The third doping region may be a (n+)-type doping region.

In some embodiments, the transistors may constitute a five-transistor structure having a reset transistor, a source follower transistor, a select transistor, a transfer transistor, and a bias transistor.

According to some example embodiments, a CMOS image sensor may include a semiconductor substrate, a plurality of color filters, and a plurality of micro-lenses. The semiconductor substrate may have a plurality of unit pixels. Each of the unit pixels may include a photodiode that has a slope shape based on incident angle of light. The color filters may be laminated above the unit pixels in a slope direction based on the incident angle of the light. The micro-lenses may be laminated on the color filters in the slope direction based on the incident angle of the light.

In some embodiments, the photodiode may include a plurality of doping regions. The doping regions may be laminated in the slope direction based on the incident angle of the light.

In some embodiments, the doping regions of the photodiode in the unit pixel arranged on an edge portion of an image sensor pixel array may be laminated in a greater slope direction compared to the doping regions of the photodiode in the unit pixel arranged on a center portion of the image sensor pixel array.

In some embodiments, the CMOS image sensor may employ a bayer pattern technique.

In some embodiments, the color filters may include a red filter, a green filter, and a blue filter.

In some embodiments, the color filters may include a yellow filter, a magenta filter, and a cyan filter.

In some embodiments, the CMOS image sensor may be a back-illuminated image sensor that generates image data based on the light illuminating on a back side of the semiconductor substrate.

In some embodiments, the color filters and the micro-lenses may be laminated in a back side direction of the semiconductor substrate.

In some embodiments, the photodiode may include a first doping region that is formed in the semiconductor substrate, a second doping region that is formed above the first doping region in the slope direction based on the incident angle of the light, and a third doping region that is formed above the second doping region in the slope direction based on the incident angle of the light.

In some embodiments, the first doping region may be a (n−)-type doping region. The second doping region may be a (n−)-type doping region. The third doping region may be a (n+)-type doping region.

In some embodiments, the CMOS image sensor may be a front-illuminated image sensor that generates image data based on the light illuminating on a front side of the semiconductor substrate.

In some embodiments, the color filters and the micro-lenses may be laminated in a front side direction of the semiconductor substrate.

In some embodiments, the photodiode may include a first doping region that is formed in the semiconductor substrate, a second doping region that is formed below the first doping region in the slope direction based on the incident angle of the light, and a third doping region that is formed below the second doping region in the slope direction based on the incident angle of the light.

In some embodiments, the first doping region may be a (n−)-type doping region. The second doping region may be a (n−)-type doping region. The third doping region may be a (n+)-type doping region.

According to some example embodiments, a unit pixel for a CMOS image sensor includes a photodiode having a slope shape to improve spectral characteristics such that an optical crosstalk due to incident light may be efficiently prevented. Thus, the unit pixel may be used in a CMOS image sensor to generate high-quality images.

According to some example embodiments, a CMOS image sensor may efficiently prevent an optical crosstalk due to incident light by laminating unit pixels, color filters, and micro lenses in a slope direction of incident angle of light. Thus, the CMOS image sensor may generate high-quality images.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
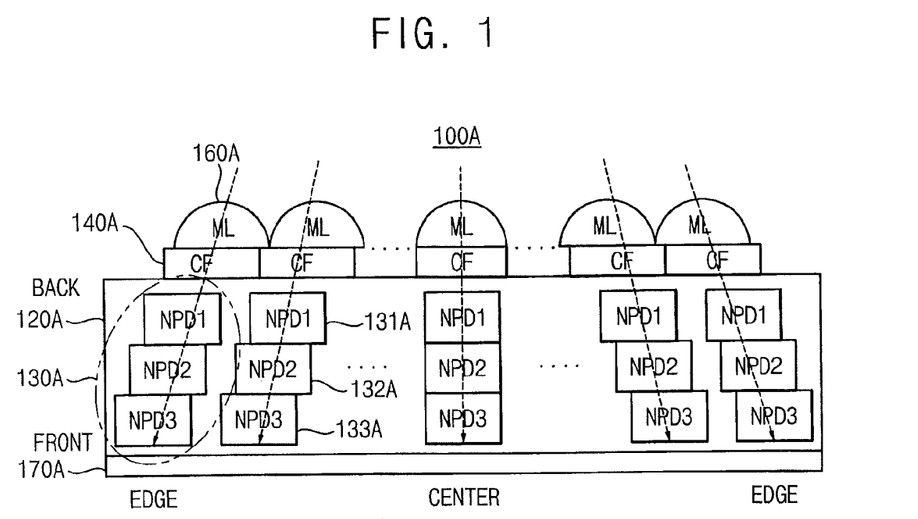
FIG. 1 is a diagram illustrating a CMOS image sensor according to some example embodiments.

FIG. 1 is a diagram illustrating a CMOS image sensor according to some example embodiments.

Referring to FIG. 1, the CMOS image sensor 100A may include a semiconductor substrate 120A including a plurality of unit pixels 130A, a plurality of color filters (CF) 140A, and a plurality of micro lenses (ML) 160A. In addition, the CMOS image sensor 100A may further include an insulation layer 170A formed on a front side FRONT of the semiconductor substrate 120A. That is, the CMOS image sensor 100A may be a back-illuminated image sensor that generates image data based on light illuminating on a back side BACK of the semiconductor substrate 120A.

The semiconductor substrate 120A may include the unit pixels 130A having a slope shape based on a slope angle of the light. Each of the unit pixels 130A may include a photodiode having a first through third doping regions 131A, 132A, and 133A. The first through third doping regions 131A, 132A, and 133A may be laminated in a slope direction (dotted arrows) based on the slope angle of the light. In an exemplary embodiment, the semiconductor substrate 120A may be a (p)-type epitaxial substrate. Here, the first through third doping regions 131A, 132A, and 133A may be formed by implanting (n)-type ions into the semiconductor substrate 120A. In an exemplary embodiment, the third doping region 133A may be formed by implanting (n+)-type ions into the semiconductor substrate 120A, and the first and second doping regions 131A and 132A may be formed by implanting (n−)-type ions into the semiconductor substrate 120A. Although the photodiode in each of the unit pixels 130A is illustrated in FIG. 1 as including the first through third doping regions 131A, 132A, and 133A, the number of doping regions included in the photodiode is not limited thereto.

In an image sensor pixel array, the unit pixels 130A may be arranged in a matrix manner. Thus, the unit pixels 130A arranged on an edge portion EDGE of the image sensor pixel array may have a greater slope angle compared to the unit pixels 130A arranged on a center portion CENTER of the image sensor pixel array. That is, the first through third doping regions 131A, 132A, and 133A of the unit pixels 130A arranged on the edge portion EDGE of the image sensor pixel array may be laminated in a greater slope direction compared to the first through third doping regions 131A, 132A, and 133A of the unit pixels 130A arranged on the center portion CENTER of the image sensor pixel array. For example, as illustrated in FIG. 1, the first through third doping regions 131A, 132A, and 133A of the unit pixels 130A arranged on the center portion CENTER of the image sensor pixel array may be laminated in a parallel direction to a direction of the light (i.e., in a vertical direction to the semiconductor substrate 120A). On the other hand, the first through third doping regions 131A, 132A, and 133A of the unit pixels 130A arranged on the edge portion EDGE of the image sensor pixel array may be laminated in the slope direction based on the incident angle of the light. Although the first through third doping regions 131A, 132A, and 133A of the unit pixels 130A are illustrated as being laminated in two-dimensional space, the first through third doping regions 131A, 132A, and 133A of the unit pixels 130A should be understood to be laminated in three-dimensional space because the unit pixels 130A are arranged on the image sensor unit array in the matrix manner.

The color filters 140A may be formed on the back side BACK of the semiconductor substrate 120a. The color filters 140A may be laminated above the unit pixels 130A in the slope direction based on the slope angle of the light. For example, the color filters 140A may be laminated above the unit pixels 130A while maintaining the slope direction in which the first through third doping regions 131A, 132A, and 133A are laminated. In an exemplary embodiment, when the CMOS image sensor 100A employs a bayer pattern technique, the color filters 140A may include a red filter R, a green filter G, and a blue filter B. In an exemplary embodiment, when the CMOS image sensor 100A employs the bayer pattern technique, the color filters 140A may include a yellow filter Y, a magenta filter M, and a cyan filter C. The micro lenses 160A may be formed on the color filters 140A. The micro lenses 160A may be laminated above the unit pixels 130A in the slope direction based on the slope angle of the light. For example, the micro lenses 160A may be laminated on the color filters 140A while maintaining the slope direction in which the first through third doping regions 131A, 132A, and 133A are laminated.

The insulation layer 170A may be formed on the front side FRONT of the semiconductor substrate 120A. Each of the unit pixels 130A includes the photodiode that transforms the light to an electric charge, and that accumulates the electric charge, and a plurality of transistors that generate an electric signal corresponding to the accumulated electric charge. In addition, the insulation layer 170A may include gate terminals of the transistors in the unit pixels 130A, and a plurality of multi-layer metal wirings. In an exemplary embodiment, a protective layer for protecting elements may be formed on the insulation layer 170A. The CMOS image sensor 100A may be coupled to a plurality of logic circuits that generate image data based on the electric signal output from the CMOS image sensor 100A. For example, the logic circuits may include a timing generator, a row decoder, a row driver, a column decoder, a multiple-correlation sampler, an analog-digital converter, and a latch unit. The timing generator may provide timing signals and control signals to the row decoder and the column decoder. The row driver may provide driving signals to the unit pixels 130A of the CMOS image sensor 100A based on an output of the row decoder. The multiple-correlation sampler may sample and maintain the electric signal. The analog-digital converter may convert the electric signal (i.e., an analog signal) to a digital signal. The latch unit may latch the digital signal to sequentially output the latched digital signal based on an output of the column decoder.

As described above, the CMOS image sensor 100A may include the unit pixels 130A having the slope shape based on the slope angle of the light. In addition, the CMOS image sensor 100A may include the color filters 140A laminated above the unit pixels 130A in the slope direction based on the slope angle of the light, and the micro lens 160A laminated above the unit pixels 130A in the slope direction based on the slope angle of the light. As a result, the light moves along a path formed by one micro lens 160A, one color filter 140A, and one unit pixel 130A. Thus, an efficiency of the CMOS image sensor 100A may be improved because the light is received without any losses by the photodiode including the first through third doping regions 131A, 132A, and 133A laminated in the slope direction based on the slope angle of the light. Further, since the light is not received by other photodiodes, an optical crosstalk is efficiently prevented such that spectral characteristics of the CMOS image sensor 100A may be improved.

FIGS. 2A through 2F are cross-sectional views illustrating a manufacturing process of a CMOS image sensor of FIG. 1.

Referring to FIGS. 2A through 2F, the unit pixels 130A may be formed in the semiconductor substrate 120A. In an exemplary embodiment, the semiconductor substrate 120A may be the (p)-type epitaxial substrate. For example, the semiconductor substrate 120A may be manufactured by forming a (p)-type epitaxial layer on a (p)-type bulk silicon substrate. Each of the unit pixels 130A transforms the light to the electric charge, accumulates the electric charge, and generates the electric signal corresponding to the accumulated electric charge. For these operations, each of the unit pixels 130A may include the photodiode and the transistors. Each of the unit pixels 130A may have one-transistor structure, three-transistor structure, four-transistor structure, or five-transistor structure. For example, when each of the unit pixels 130A has five-transistor structure, each of the unit pixels 130A may include a reset transistor, a source follower transistor, a select transistor, a transfer transistor, and a bias transistor. Hereinafter, the manufacturing process of the CMOS image sensor of FIG. 1 will be described in detail.

Figure 2A:
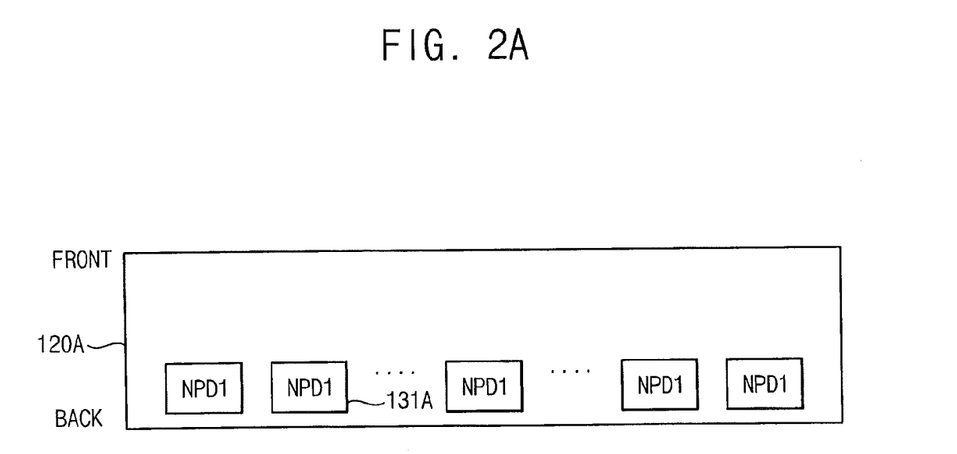
FIGS. 2A through 2F are cross-sectional views illustrating a manufacturing process of a CMOS image sensor of FIG. 1.
Figure 2B:
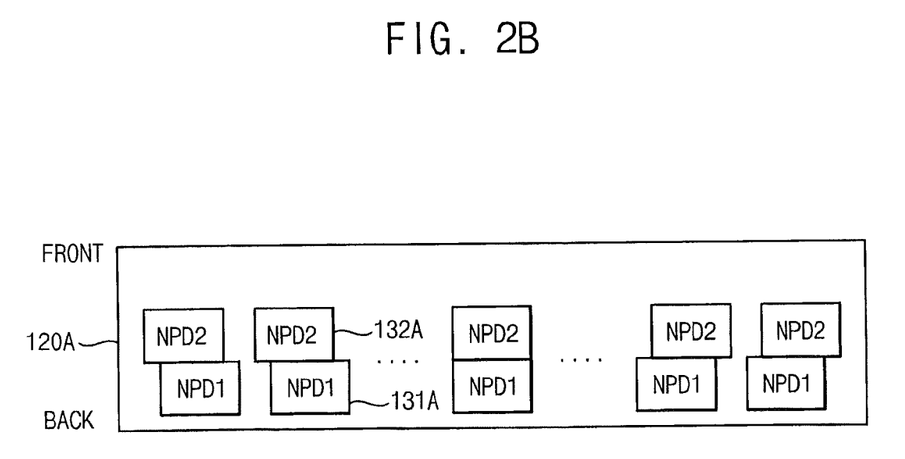
Figure 2C:
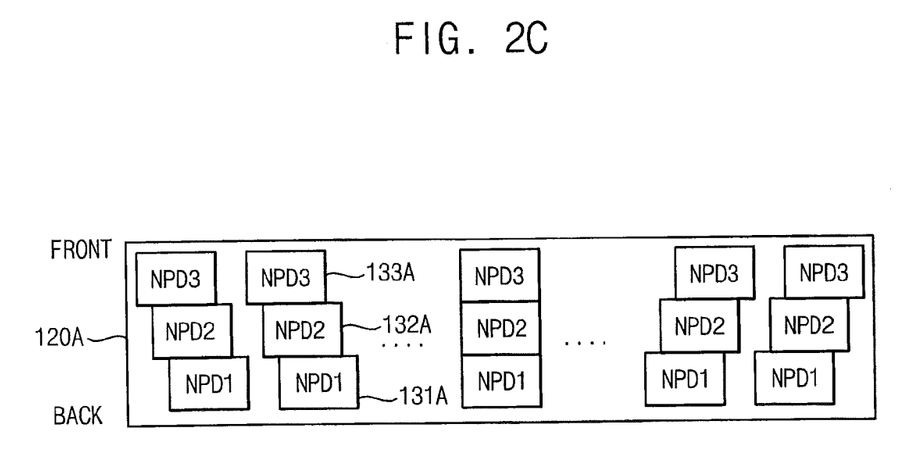

Referring to FIG. 2A, the first doping region 131A of the photodiode may be formed in the semiconductor substrate 120A. For example, the first doping region 131A may be formed by performing an ion-implantation process. In an exemplary embodiment, the first doping region 131A may be a (n)-type region formed in the (p)-type epitaxial layer of the semiconductor substrate 120A. Referring to FIG. 2B, the second doping region 132A of the photodiode may be formed (i.e., laminated) above the first doping region 131A. For example, the second doping region 132A may be formed by performing the ion-implantation process. In an exemplary embodiment, the second doping region 132A may be a (n)-type region formed (i.e., laminated) above the first doping region 131A in the (p)-type epitaxial layer of the semiconductor substrate 120A. Referring to FIG. 2C, the third doping region 133A of the photodiode may be formed above the second doping region 132A. For example, the third doping region 133A may be formed by performing the ion-implantation process. In an exemplary embodiment, the third doping region 133A may be (n)-type region formed (i.e., laminated) above the second doping region 132A in the (p)-type epitaxial layer of the semiconductor substrate 120A. As described above, the third doping region 133A may be the (n+)-type doping region that is formed by implanting (n+)-type ions in the (p)-type epitaxial layer of the semiconductor substrate 120A, the first doping region 131A may be the (n−)-type doping region that is formed by implanting (n−)-type ions in the p-type epitaxial layer of the semiconductor substrate 120A, and the second doping region 132A may be the (n−)- type doping region that is formed by implanting (n–)-type ions in the p-type epitaxial layer of the semiconductor substrate 120A.

Here, the first through third doping region 131A, 132A, and 133A may be laminated in the slope direction based on the slope angle of the light. Particularly, the first through third doping regions 131A, 132A, and 133A of the unit pixels 130A arranged on the edge portion EDGE of the image sensor pixel array may be laminated in the greater slope direction compared to the first through third doping regions 131A, 132A, and 133A of the unit pixels 130A arranged on the center portion CENTER of the image sensor pixel array. Although the first through third doping regions 131A, 132A, and 133A of the unit pixels 130A are illustrated as being laminated in two-dimensional space, the first through third doping regions 131A, 132A, and 133A of the unit pixels 130A should be understood to be laminated in three-dimensional space because the unit pixels 130A are arranged on the image sensor pixel array in the matrix form. Further, although the photodiode in each of the unit pixels 130A is illustrated in FIGS. 2A through 2C as including three doping regions, the number of doping regions included in the photodiode is not limited thereto. In an exemplary embodiment, element isolation regions may be formed among the unit pixels 130A. The element isolation regions may be formed using a field oxide (FOX) by a shallow trench isolation (STI) process or a local oxidation of silicon (LOCOS) process.

Figure 2D:
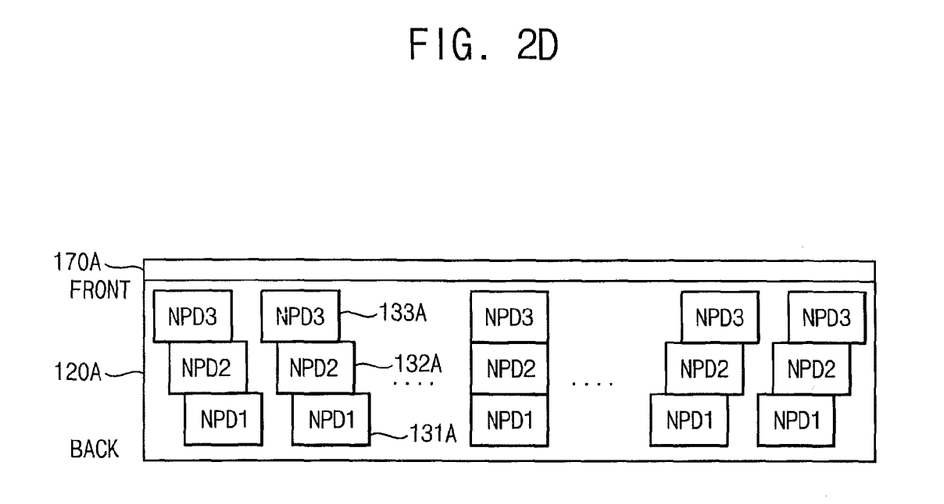

Referring to FIG. 2D, the isolation layer 170A may be formed on the front side FRONT of the semiconductor substrate 120A. The isolation layer 170A may include the gate terminals of transistors, and the multi-layer metal wirings. The isolation layer 170A may be formed by a material having good gap-fill characteristics. For example, the material having good gap-fill characteristics may be a high density plasma (HDP), a tonen silazene (TOSZ), a spin on glass (SOG), a undoped silica glass (USG), or combinations thereof In an exemplary embodiment, the gate terminals in the insulation layer 170A may be formed by laminating a gate insulation layer and a gate conductive layer on the front side FRONT of the semiconductor substrate 120A, and by patterning the gate insulation layer and the gate conductive layer laminated on the front side FRONT of the semiconductor substrate 120A. The multi-layer metal wirings in the insulation layer 170A may be formed by patterning a conductive material having a metal such as copper, aluminum, etc. In an exemplary embodiment, the protective layer for protecting elements may be formed on the insulation layer 170A.

Figure 2E:
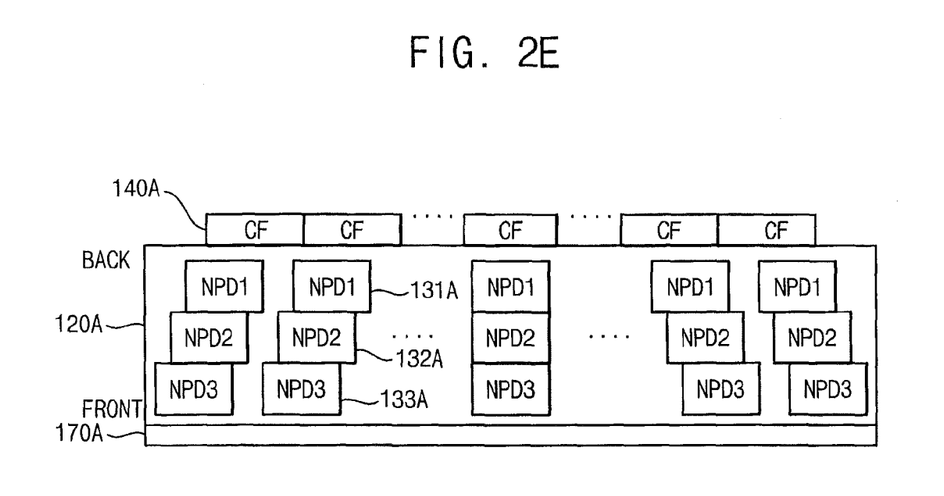

Referring to FIG. 2E, the color filters 140A may be formed on the back side BACK of the semiconductor substrate 120A in the slope direction based on the slope angle of the light. Each of the color filters 140A passes the light having a different wavelength range according to types of the color filters 140A (e.g., the blue filter B, the green filter G, and the red filter R). In an exemplary embodiment, the color filters 140A may be formed above the unit pixels 130A while maintaining the slope direction in which the first through third doping regions 131A, 132A, and 133A of the unit pixels 130A are laminated. As described above, the color filters 140A may include sets of the red filter R, the green filter G, and the blue filter B, or sets of the yellow filter Y, a magenta filter M, and a cyan filter C. The color filters 140A may be formed by coating the back side BACK of the semiconductor substrate 120A with a photosensitive material (e.g., a photo-resist), and by patterning the photosensitivity material (e.g., performing the photolithography and lithography process using masks). In an exemplary embodiment, a flat layer (i.e., an over-coating layer) may be coated on the color filters 140A.

Figure 2F:
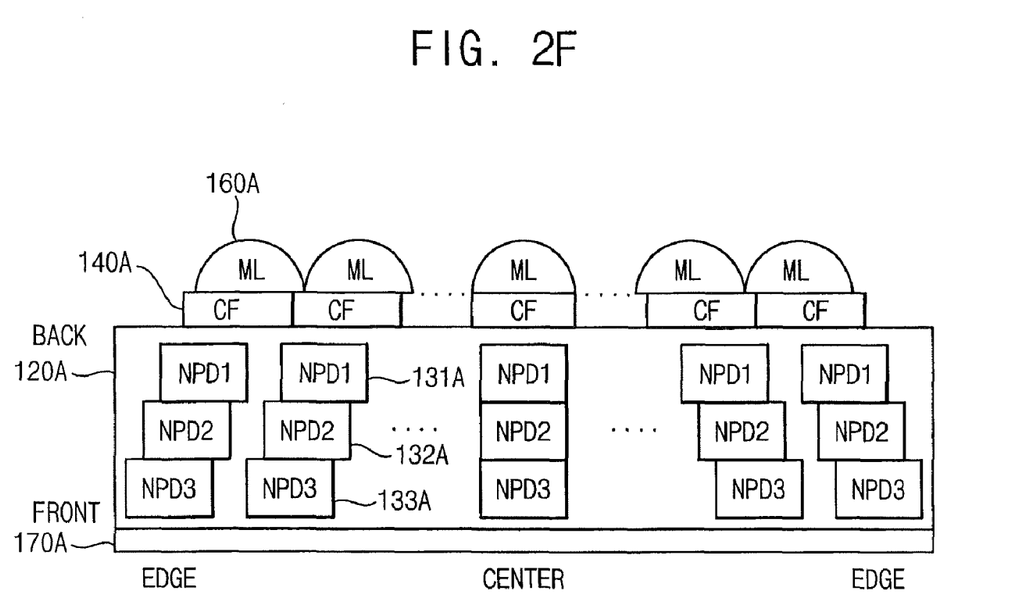

Referring to FIG. 2F, the micro lenses 160A may be formed on the color filters 140A in the slope direction based on the slope angle of the light. For example, the micro lenses 160A may be formed above the unit pixels 130A while maintaining the slope direction in which the first through third doping region 131A, 132A, and 133A of the unit pixels 130A are laminated. In an exemplary embodiment, the micro lenses 160A may be formed by generating a plurality of patterns using a beam penetration photo-resist, and by performing a reflow process for the plurality of patterns. Since the manufacturing process of the CMOS image sensor 100A illustrated in FIGS. 2A through 2F is an exemplary embodiment, the manufacturing process of the CMOS image sensor 100A is not limited thereto.

Figure 3A:
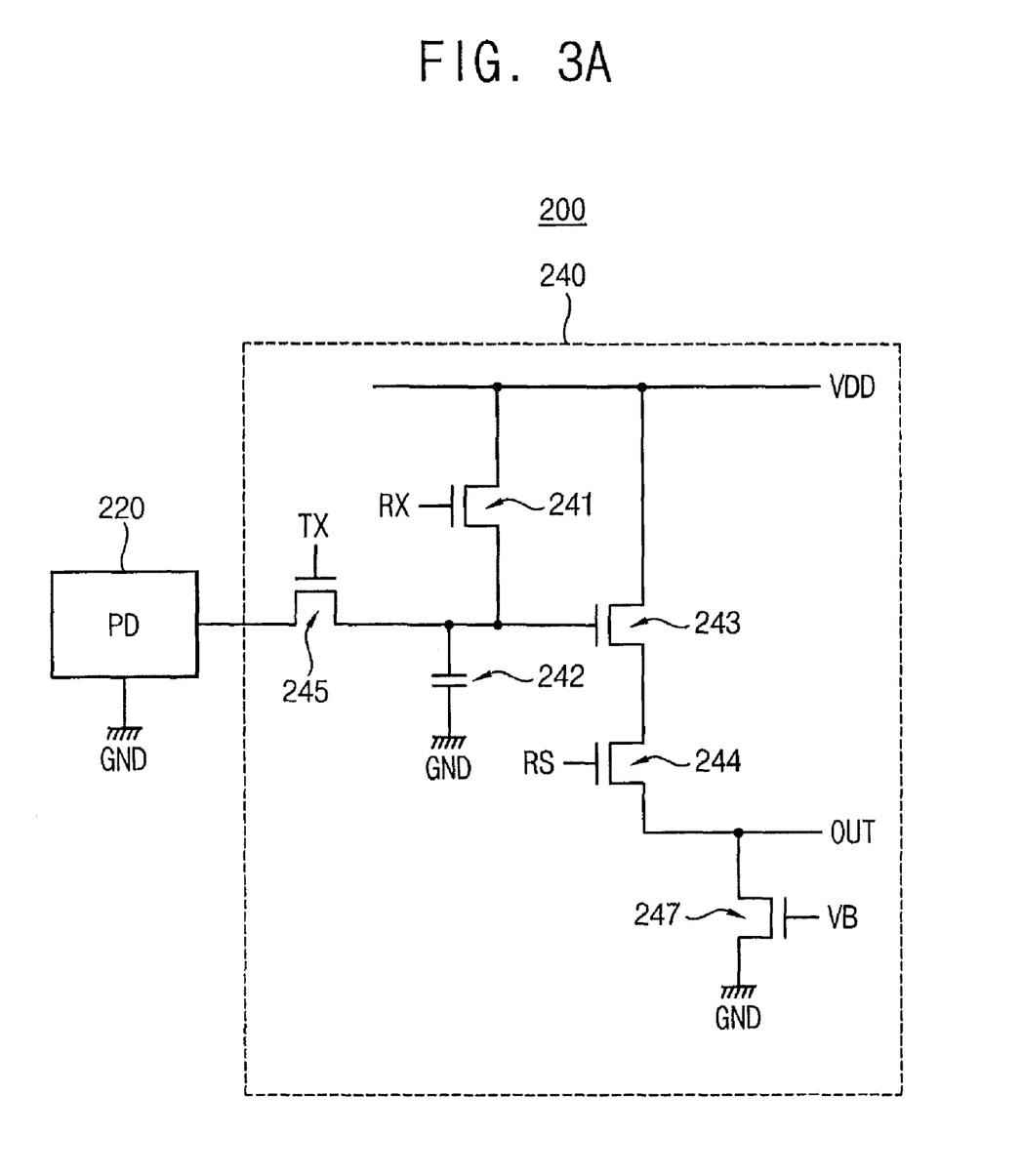
FIG. 3A is a circuit diagram illustrating a unit pixel of a CMOS image sensor of FIG. 1.

FIG. 3A is a circuit diagram illustrating a unit pixel of a CMOS image sensor of FIG. 1.

Referring to FIG. 3A, the unit pixel 200 may include a photodiode 220 and a main circuit 240 having a capacitor 242 and a plurality of transistors 241, 243, 244, 245, and 247. As described above, the unit pixel 200 may have one-transistor structure, three-transistor structure, four-transistor structure, or five-transistor structure according to the number of transistors. As illustrated in FIG. 3A, the unit pixel 200 has five-transistor structure. The five-structure may include a reset transistor 241, a source follower transistor 243, a select transistor 244, a transfer transistor 245, and a bias-transistor 247. In addition, a floating diffusion node may be formed by a capacitor 242.

In the reset transistor 241, a gate terminal of the reset transistor 241 may receive a reset signal RX, a first terminal of the reset transistor 241 may be coupled to the floating diffusion node, and a second terminal of the reset transistor 241 may be coupled to a power voltage VDD. In the source follower transistor 243, a gate terminal of the source follower transistor 243 may be coupled to the floating diffusion node, a first terminal of the source follower transistor 243 may be coupled to a second terminal of the select transistor 244, and a second terminal of the source follower transistor 243 may be coupled to the power voltage VDD. In the select transistor 244, a gate terminal of the select transistor 244 may receive a row selection signal RS, a first terminal of the select transistor 244 may be coupled to an output terminal OUT, and the second terminal of the select transistor 244 may be coupled to the first terminal of the source follower transistor 243. In the transfer transistor 245, a gate terminal of the transfer transistor 245 may receive a transfer signal TX, a first terminal of the transfer transistor 245 may be coupled to the photodiode 220, and a second terminal of the transfer transistor 245 may be coupled to the floating diffusion node. Thus, the transfer transistor 245 may transfer the electric charge accumulated by the photodiode 220 to the floating diffusion node. In the bias transistor 247, a gate terminal of the bias transistor 247 may receive a bias voltage VB, a first terminal of the bias transistor 247 may be coupled to the output terminal OUT, and a second terminal of the bias transistor 247 may be coupled to a ground voltage GND. The photodiode 220 may perform photoelectric transformations, and may be placed between the transfer transistor 245 and the ground voltage GND. As described above, the photodiode 220 may include a plurality of doping regions that are laminated in the slope direction based on the slope angle of the light.

According to operations of the unit pixel 200, the photodiode 220 transforms the light to the electric charge. The transfer transistor 245 turns on when the transfer signal TX is input to the gate terminal of the transfer transistor 245. Thus, the electric charge accumulated by the photodiode 220 may be transferred to the floating diffusion node when the transfer signal TX is input to the gate terminal of the transfer transistor 245. Here, the reset transistor 241 is maintained in a turn-off state such that electric potential of the floating diffusion node may be changed by the electric charge transferred to the floating diffusion node. As the electric potential of the floating diffusion node is changed, the electric potential of the gate terminal of the source follower transistor 243 may be changed. Then, a bias of the first terminal of the source follower transistor 243 (i.e., a bias of the second terminal of the select transistor 244) may be changed. Here, when the row selection signal RS is input to the gate terminal of the select transistor 244, the electric signal corresponding to the accumulated electric charge may be output through the output terminal OUT. After the electric signal corresponding to the electric charge generated by the photodiode 220 is detected, the reset signal RX is input to the gate terminal of the reset transistor 241. Then, the reset transistor 241 turns on by the reset signal RX such that a sensing process may be initialized. Although the unit pixel 200 having five-transistor structure is illustrated in FIG. 3A, the structure of the unit pixel 200 is not limited thereto.

Figure 3B:
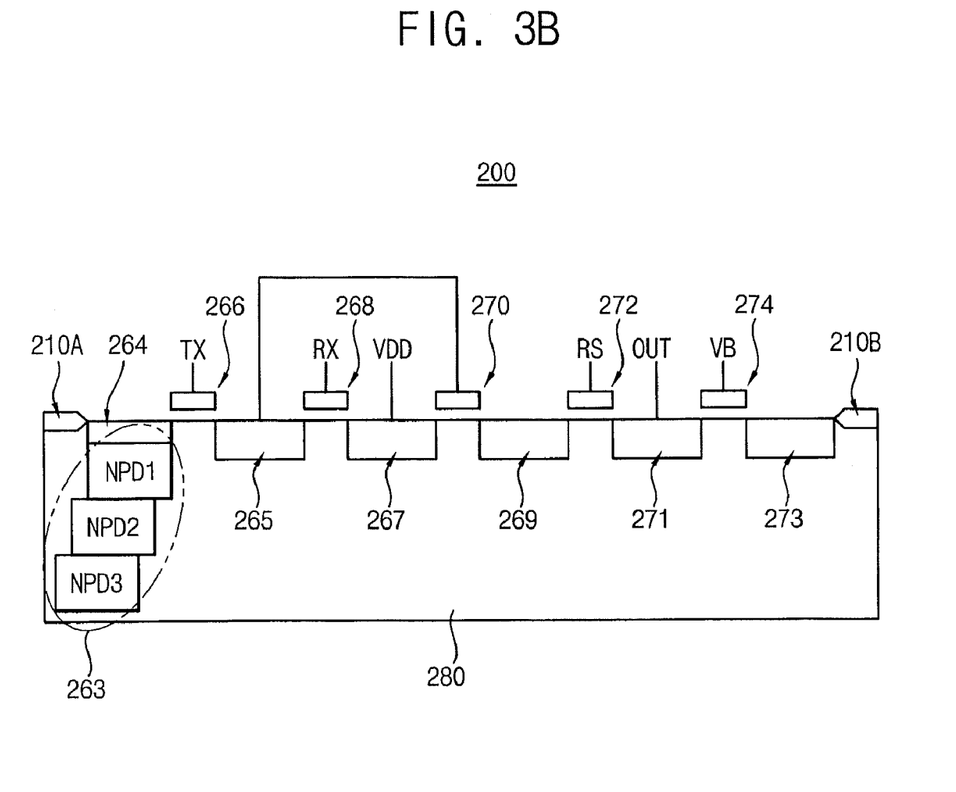
FIG. 3B is a cross-sectional view illustrating a unit pixel of a CMOS image sensor of FIG. 3A.

FIG. 3B is a cross-sectional view illustrating a unit pixel of a CMOS image sensor of FIG. 3A.

Referring to FIG. 3B, an active region of the unit pixel 200 may be defined by device isolation layers 210A and 210B on the semiconductor substrate 280. The photodiode 220 may be formed on the semiconductor substrate 280. Here, the photodiode 220 may include a plurality of (n)-type doping regions 263 below a (p)-type doping region 264. The (n)-type doping regions 263 may be laminated in the slope direction based on the slope angle of the light. Although the (n)-type doping regions 263 are illustrated as being laminated in two-dimensional space, the (n)-type doping regions 263 should be understood to be laminated in three-dimensional space.

A first (n+)-type doping region 265 may be formed at a position that is separated from the (p)-type doping region 264 by a certain distance. The first (n+)-type doping region 265 may act as the floating diffusion node for sensing the electric charge accumulated by the photodiode 220. The gate terminal 266 of the transfer transistor 245 may be formed on the semiconductor substrate 280 at a position that is placed between the (p)-type doping region 264 and the first (n+)-type doping region 265. The gate terminal 268 of the reset transistor 241 may be formed on the semiconductor substrate 280 at a position that is placed between the first (n+)-type doping region 265 and the second (n+)-type doping region 267. The gate terminal 270 of the source follower transistor 243 may be formed on the semiconductor substrate 280 at a position that is placed between the second (n+)-type doping region 267 and the third (n+)-type doping region 269. The gate terminal 272 of the select transistor 244 may be formed on the semiconductor substrate 280 at a position that is placed between the third (n+)-type doping region 269 and the fourth (n+)-type doping region 271. The gate terminal 274 of the bias transistor 247 may be formed on the semiconductor substrate 280 at a position that is placed between the fourth (n+)-type doping region 271 and the fifth (n+)-type doping region 273. The transfer signal TX may be input to the gate terminal 266 of the transfer transistor 245. The reset signal 268 may be input to the gate terminal 268 of the reset transistor 241. The gate terminal 270 of the source follower transistor 243 may be coupled to the first (n+)-type doping region 265. The row selection signal RS may be input to the gate terminal 272 of the select transistor 244. The bias voltage VB may be input to the gate terminal 274 of the bias transistor 247. For the convenience of the description, insulation layers between the semiconductor substrate 280 and the transistors 266, 268, 270, 272, and 274 are not illustrated in FIG. 3B. In addition, although the unit pixel 200 having five-transistor structure are illustrated in FIG. 3B, the structure of the unit pixel 200 is not limited thereto.

Figure 4:
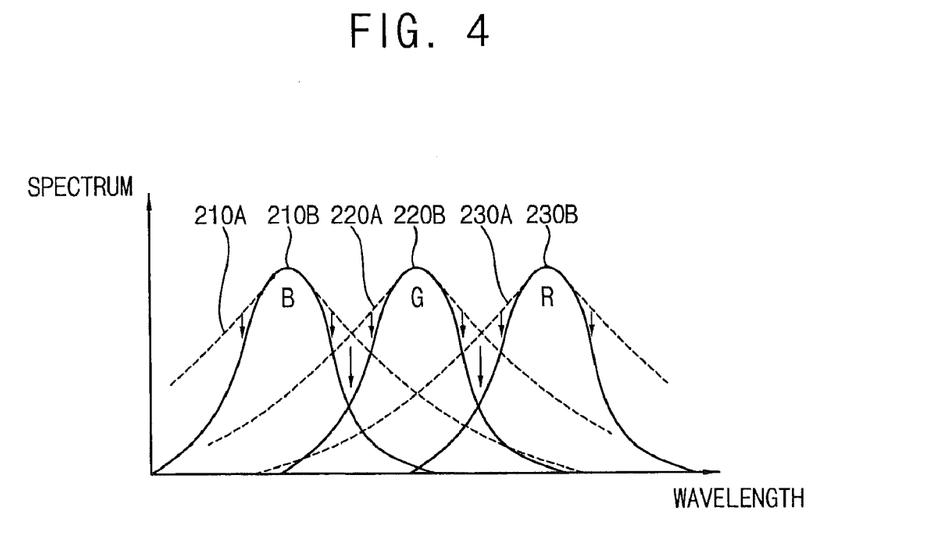
FIG. 4 is a graph illustrating spectral characteristics of a CMOS image sensor of FIG. 1.

FIG. 4 is a graph illustrating spectral characteristics of a CMOS image sensor of FIG. 1.

Referring to FIG. 4, the color filters 140A may include sets of the blue filter B, the green filter G, and the red filter R. The color filters 140A may have different transmittances according to types of the color filters 140A (e.g., the blue filter B, the green filter G, and the red filter R). Thus, each of the color filters 140A passes the light having a different wavelength range according to types of the color filters 140A (e.g., the blue filter B, the green filter G, and the red filter R). Since photodiodes of conventional CMOS image sensor are not manufactured to have the slope shape based on the slope angle of the light, the light passing through the blue filter B, the green filter G, or the red filter R may be captured by not only photodiodes of corresponding unit pixels 120A but also photodiodes of peripheral unit pixels 120A. Thus, the conventional CMOS image sensor may not prevent the optical crosstalk such that spectral characteristics of conventional CMOS image sensor are relatively bad as indicated by first graphs 210A, 220A, and 230A. On the other hand, since photodiodes of the CMOS image sensor of FIG. 1 are manufactured having the slope shape based on the slope angle of the light, the light passing through the blue filter B, the green filter G, or the red filter R may be captured by only photodiodes of corresponding unit pixels 120A. Thus, the CMOS image sensor of FIG. 1 may prevent the optical crosstalk such that spectral characteristics of the CMOS image sensor of FIG. 1 are relatively good as indicated by second graphs 210B, 220B, and 230B.

Figure 5:
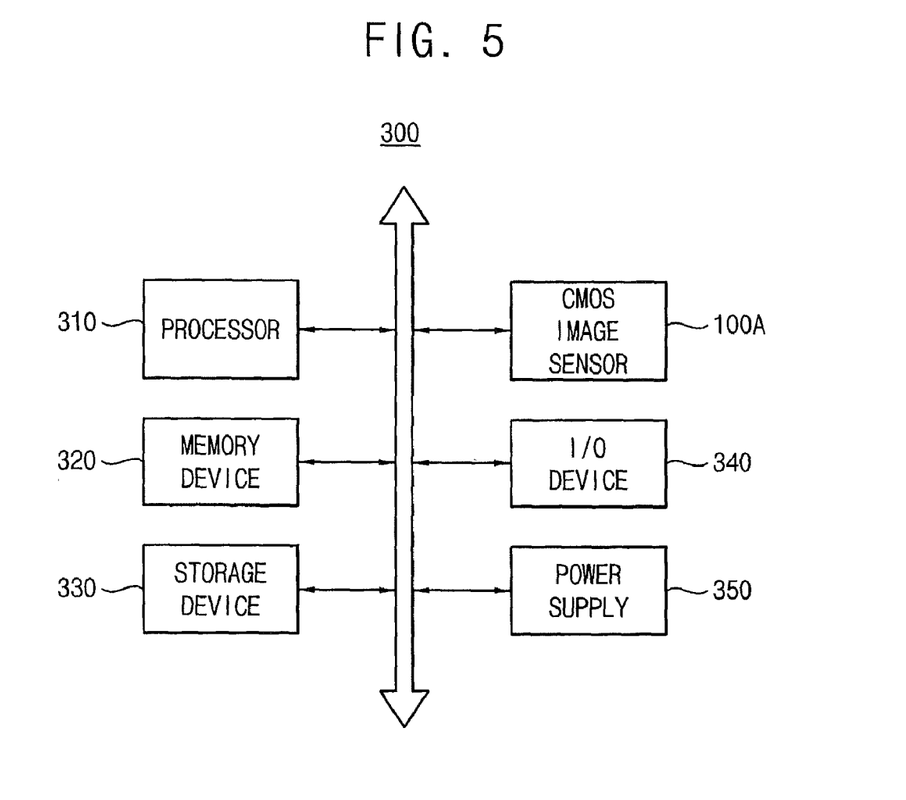
FIG. 5 is a block diagram illustrating an electric device having a CMOS image sensor of FIG. 1.

FIG. 5 is a block diagram illustrating an electric device having a CMOS image sensor of FIG. 1.

Referring to FIG. 5, the electric device 300 may include the CMOS image sensor 100A, a processor 310, a memory device 320, a storage device 330, an input/output (I/O) device 340, and a power supply 350.

The processor 310 may perform various computing functions. The processor 310 may be a micro processor, a central processing unit (CPU), and etc. The processor 310 may be coupled to the memory device 320 through a bus such as an address bus, a control bus, a data bus, etc. The memory device 320 may be a dynamic random access memory (DRAM) device, a static random access memory (SRAM) device, an erasable programmable read-only memory (EPROM) device, an electrically erasable programming read-only memory (EEPROM) device, a flash memory device, etc. The processor 310 may be coupled to a bus such as a peripheral component interconnection (PCI) bus. As a result, the processor 310 may control at least one input device 340 such as a keyboard, a keypad, a mouse, etc, at least one output device 340 such as a printer, a display device, etc, and/or at least one storage device 330 such as a solid state drive, a hard disk drive, a CD-ROM, etc. The processor 310 may communicate with the CMOS image sensor 100A through a bus or other communication links. The power supply 350 may provide operation power for the electric device 300. Further, the electric device 300 may further include a plurality of ports for communicating with a video card, a sound card, a memory card, a USB device, other system, etc. In an exemplary embodiment, the CMOS image sensor 100A may be integrated with the processor 310 in one chip. Here, the electric device 300 may be a computer, a digital camera, a cellular phone, a personal digital assistant (PDA), a scanner, a navigation system, a video phone, an auto-focusing system, etc.

Figure 6:
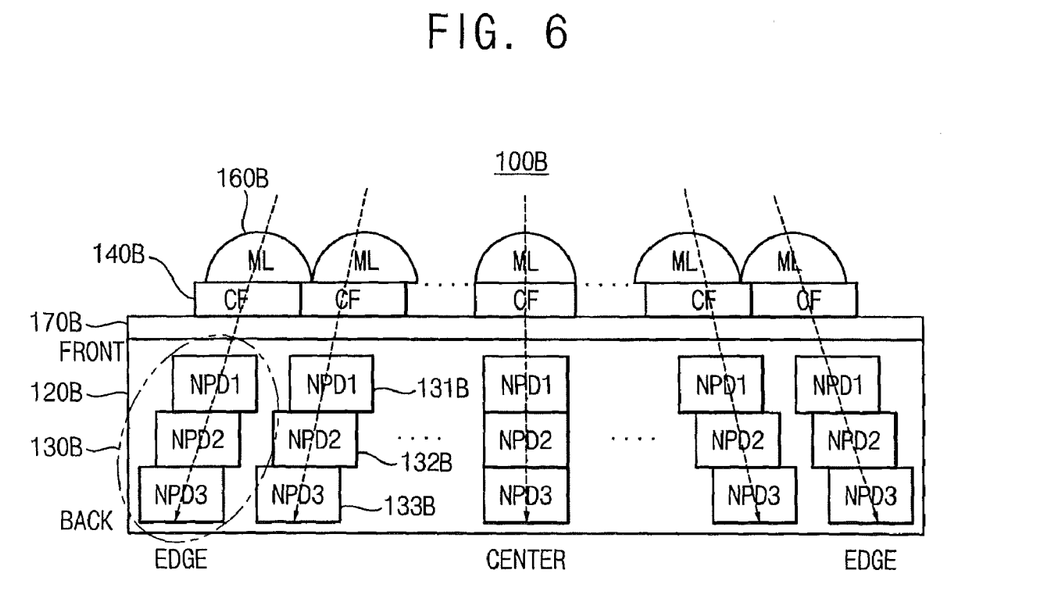
FIG. 6 is a diagram illustrating a CMOS image sensor according to some example embodiments.

FIG. 6 is a diagram illustrating a CMOS image sensor according to some example embodiments.

Referring to FIG. 6, the CMOS image sensor 100B may include a semiconductor substrate 120B including a plurality of unit pixels 130B, a plurality of color filters (CF) 140B, and a plurality of micro lenses (ML) 160B. In addition, the CMOS image sensor 100B may further include an insulation layer 170B formed on a front side FRONT of the semiconductor substrate 120B. That is, the CMOS image sensor 100B may be a front-illuminated image sensor that generates image data based on light illuminating on the front side FRONT of the semiconductor substrate 120B.

The semiconductor substrate 120B may include the unit pixels 130B having a slope shape based on a slope angle of the light. Each of the unit pixels 130B may include a photodiode having a first through third doping regions 131B, 132B, and 133B. The first through third doping regions 131B, 132B, and 133B may be laminated in a slope direction (dotted arrows) based on the slope angle of the light. In an exemplary embodiment, the semiconductor substrate 120B may be a (p)-type epitaxial substrate. Here, the first through third doping regions 131B, 132B, and 133B may be formed by implanting (n)-type ions into the semiconductor substrate 120B. In an exemplary embodiment, the third doping region 133B may be formed by implanting (n+)-type ions into the semiconductor substrate 120B, and the first and second doping region 131B and 132B may be formed by implanting (n−)-type ions into the semiconductor substrate 120B. Although the photodiode in each of the unit pixels 130B is illustrated in FIG. 1 as including the first through third doping regions 131B, 132B, and 133B, the number of doping regions included in the photodiode is not limited thereto.

In an image sensor pixel array, the unit pixels 130B may be arranged in a matrix manner. Thus, the unit pixels 130B arranged on an edge portion EDGE of the image sensor pixel array may have a greater slope angle compared to the unit pixels 130B arranged on a center portion CENTER of the image sensor pixel array. That is, the first through third doping regions 131B, 132B, and 133B of the unit pixels 130B arranged on the edge portion EDGE of the image sensor pixel array may be laminated in a greater slope direction compared to the first through third doping regions 131B, 132B, and 133B of the unit pixels 130A arranged on the center portion CENTER of the image sensor pixel array. For example, as illustrated in FIG. 6, the first through third doping regions 131B, 132B, and 133B of the unit pixels 130B arranged on the center portion CENTER of the image sensor pixel array may be laminated in a parallel direction to a direction of the light (i.e., in a vertical direction to the semiconductor substrate 120B). On the other hand, the first through third doping regions 131B, 132B, and 133B of the unit pixels 130B arranged on the edge portion EDGE of the image sensor pixel array may be laminated in the slope direction based on the incident angle of the light. Although the first through third doping regions 131B, 132B, and 133B of the unit pixels 130B are illustrated as being laminated in two-dimensional space, the first through third doping regions 131B, 132B, and 133B of the unit pixels 130B should be understood to be laminated in three-dimensional space because the unit pixels 130B are arranged on the image sensor unit array in the matrix manner.

The insulation layer 170B may be formed on the front side FRONT of the semiconductor substrate 120B. Each of the unit pixels 130B includes the photodiode that transforms the light to an electric charge, and that accumulates the electric charge, and a plurality of transistors that generate an electric signal corresponding to the accumulated electric charge. In addition, the insulation layer 170B may include gate terminals of the transistors in the unit pixels 130B, and a plurality of multi-layer metal wirings. In an exemplary embodiment, a protective layer for protecting elements may be formed on the insulation layer 170B.

The color filters 140B may be formed on the insulation layer 170B. The color filters 140B may be laminated above the unit pixels 130B in the slope direction based on the slope angle of the light. For example, the color filters 140B may be laminated on the insulation layer 170B while maintaining the slope direction in which the first through third doping regions 131B, 132B, and 133B are laminated. In an exemplary embodiment, when the CMOS image sensor 100B employs a bayer pattern technique, the color filters 140B may include a red filter R, a green filter G, and a blue filter B. In an exemplary embodiment, when the CMOS image sensor 100B employs the bayer pattern technique, the color filters 140B may include a yellow filter Y, a magenta filter M, and a cyan filter C. The micro lenses 160B may be formed on the color filters 140B. The micro lenses 160B may be laminated above the unit pixels 130B in the slope direction based on the slope angle of the light. For example, the micro lenses 160B may be laminated on the color filters 140B while maintaining the slope direction in which the first through third doping regions 131B, 132B, and 133B are laminated.

The CMOS image sensor 100B may be coupled to a plurality of logic circuits that generate image data based on the electric signal output from the CMOS image sensor 100B. For example, the logic circuits may include a timing generator, a row decoder, a row driver, a column decoder, a multiple-correlation sampler, an analog-digital converter, and a latch unit. The timing generator may provide timing signals and control signals to the row decoder and the column decoder. The row driver may provide driving signals to the unit pixels 130B of the CMOS image sensor 100B based on an output of the row decoder. The multiple-correlation sampler may sample and maintain the electric signal. The analog-digital converter may convert the electric signal (i.e., an analog signal) to a digital signal. The latch unit may latch the digital signal to sequentially output the latched digital signal based on an output of the column decoder.

As described above, the CMOS image sensor 100B may include the unit pixels 130B having the slope shape based on the slope angle of the light. In addition, the CMOS image sensor 100B may include the color filters 140B laminated above the unit pixels 130B in the slope direction based on the slope angle of the light, and the micro lens 160B laminated above the unit pixels 130B in the slope direction based on the slope angle of the light. As a result, the light moves along a path formed by one micro lens 160B, one color filter 140B, and one unit pixel 130B. Thus, an efficiency of the CMOS image sensor 100B may be improved because the light is received without any losses by the photodiode including the first through third doping region 131B, 132B, and 133B laminated in the slope direction based on the slope angle of the light. Further, since the light is not received by other photodiodes, an optical crosstalk is efficiently prevented such that spectral characteristics of the CMOS image sensor 100B may be improved.

FIGS. 7A through 7F are cross-sectional views illustrating a manufacturing process of a CMOS image sensor of FIG. 6.

Referring to FIGS. 7A through 7F, the unit pixels 130B may be formed in the semiconductor substrate 120B. In an exemplary embodiment, the semiconductor substrate 120B may be the (p)-type epitaxial substrate. For example, the semiconductor substrate 120B may be manufactured by forming a (p)-type epitaxial layer on a (p)-type bulk silicon substrate. Each of the unit pixels 130B transforms the light to the electric charge, accumulates the electric charge, and generates the electric signal corresponding to the accumulated electric charge. For these operations, each of the unit pixels 130B may include the photodiode and the transistors. Each of the unit pixels 130B may have one-transistor structure, three-transistor structure, four-transistor structure, or five-transistor structure. For example, when each of the unit pixels 130B has five-transistor structure, each of the unit pixels 130B may include a reset transistor, a source follower transistor, a select transistor, a transfer transistor, and a bias transistor. Hereinafter, the manufacturing process of the CMOS image sensor of FIG. 6 will be described in detail.

Figure 7A:
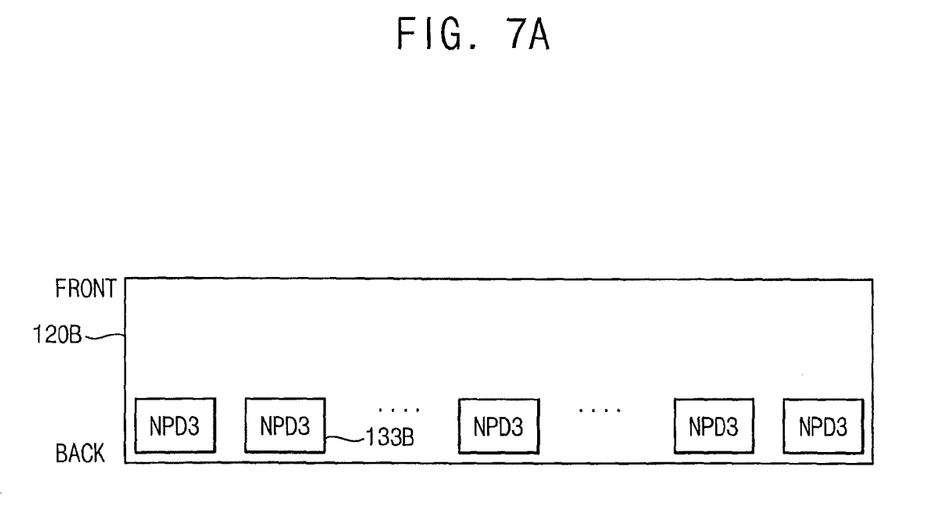
FIGS. 7A through 7F are cross-sectional views illustrating a manufacturing process of a CMOS image sensor of FIG. 6.
Figure 7B:
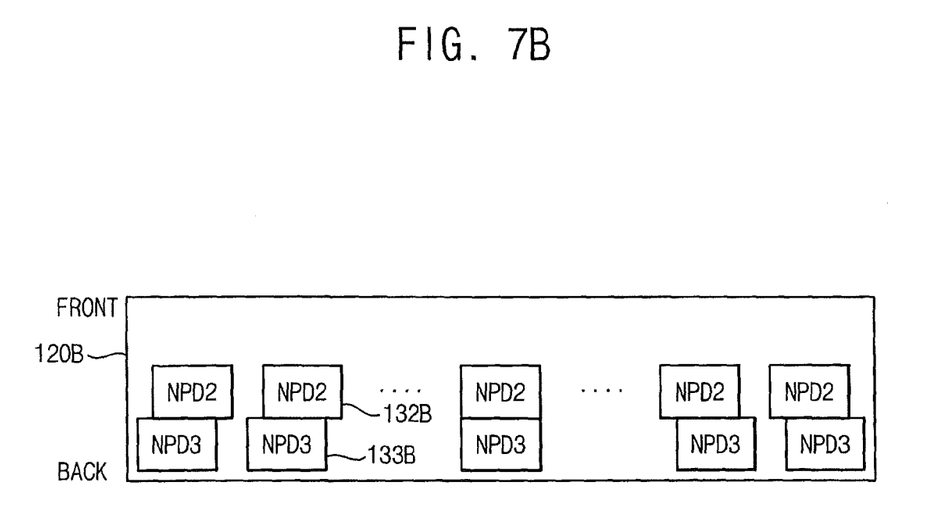
Figure 7C:
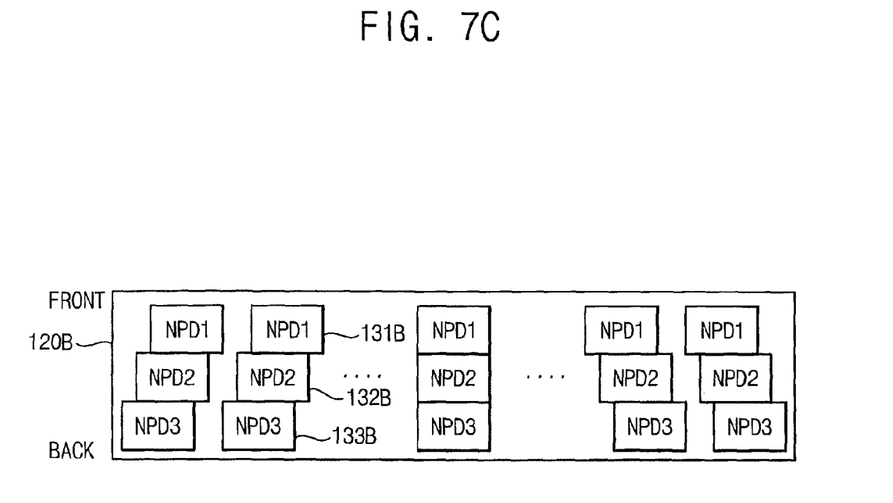

Referring to FIG. 7A, the third doping region 133B of the photodiode may be formed in the semiconductor substrate 120B. For example, the third doping region 133B may be formed by performing an ion-implantation process. In an exemplary embodiment, the third doping region 133B may be a (n)-type region formed in the (p)-type epitaxial layer of the semiconductor substrate 120B. Referring to FIG. 7B, the second doping region 132B of the photodiode may be formed (i.e., laminated) above the third doping region 133B. For example, the second doping region 132B may be formed by performing the ion-implantation process. In an exemplary embodiment, the second doping region 132B may be a (n)-type region formed (i.e., laminated) above the third doping region 133B in the (p)-type epitaxial layer of the semiconductor substrate 120B. Referring to FIG. 7C, the first doping region 131B of the photodiode may be formed above the second doping region 132B. For example, the first doping region 131B may be formed by performing the ion-implantation process. In an exemplary embodiment, the first doping region 131B may be (n)-type region formed (i.e., laminated) above the second doping region 132B in the (p)-type epitaxial layer of the semiconductor substrate 120B. As described above, the third doping region 133B may be the (n+)-type doping region that is formed by implanting (n+)-type ions in the (p)-type epitaxial layer of the semiconductor substrate 120B, the first doping region 131B may be the (n−)-type doping region that is formed by implanting (n−)-type ions in the p-type epitaxial layer of the semiconductor substrate 120B, and the second doping region 132B may be the (n−)-type doping region that is formed by implanting (n−)-type ions in the p-type epitaxial layer of the semiconductor substrate 120B.

Here, the first through third doping regions 131B, 132B, and 133B may be laminated in the slope direction based on the slope angle of the light. Particularly, the first through third doping regions 131B, 132B, and 133B of the unit pixels 130B arranged on the edge portion EDGE of the image sensor pixel array may be laminated in the greater slope direction compared to the first through third doping regions 131B, 132B, and 133B of the unit pixels 130B arranged on the center portion CENTER of the image sensor pixel array. Although the first through third doping regions 131B, 132B, and 133B of the unit pixels 130B are illustrated as being laminated in two-dimensional space, the first through third doping regions 131B, 132B, and 133B of the unit pixels 130B should be understood to be laminated in three-dimensional space because the unit pixels 130B are arranged on the image sensor pixel array in the matrix form. Further, although the photodiode in each of the unit pixels 130B is illustrated in FIGS. 7A through 7C as including three doping regions, the number of doping regions included in the photodiode is not limited thereto. In an exemplary embodiment, element isolation regions may be formed among the unit pixels 130B. The element isolation regions may be formed using a field oxide (FOX) by a shallow trench isolation (STI) process or a local oxidation of silicon (LOCOS) process.

Figure 7D:
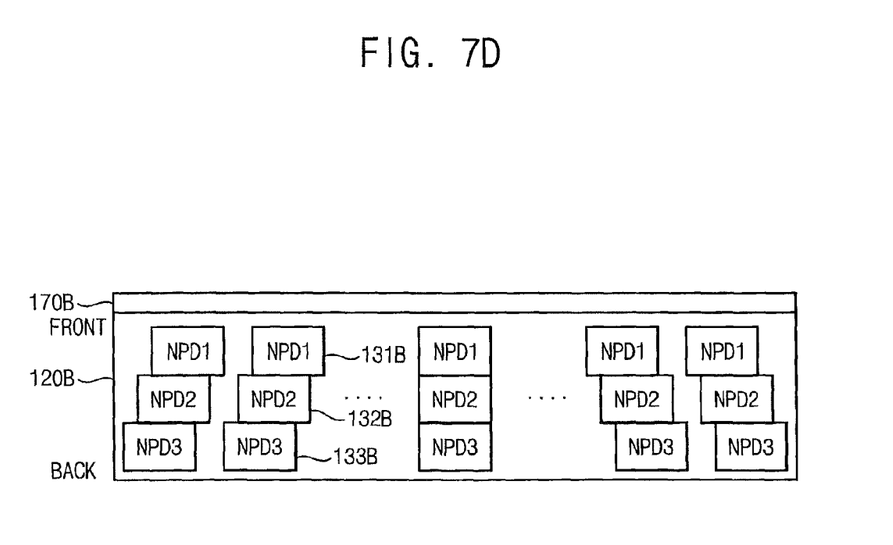

Referring to FIG. 7D, the isolation layer 170B may be formed on the front side FRONT of the semiconductor substrate 120B. The isolation layer 170B may include the gate terminals of transistors, and the multi-layer metal wirings. The isolation layer 170B may be formed by a material having good gap-fill characteristics. For example, the material having good gap-fill characteristics may be a high density plasma (HDP), a tonen silazene (TOSZ), a spin on glass (SOG), a undoped silica glass (USG), or combinations thereof. In an exemplary embodiment, the gate terminals in the insulation layer 170B may be formed by laminating a gate insulation layer and a gate conductive layer on the front side FRONT of the semiconductor substrate 120B, and by patterning the gate insulation layer and the gate conductive layer laminated on the front side FRONT of the semiconductor substrate 120B. The multi-layer metal wirings in the insulation layer 170B may be formed by patterning a conductive material having a metal such as copper, aluminum, etc. In an exemplary embodiment, the protective layer for protecting elements may be formed on the insulation layer 170B.

Figure 7E:
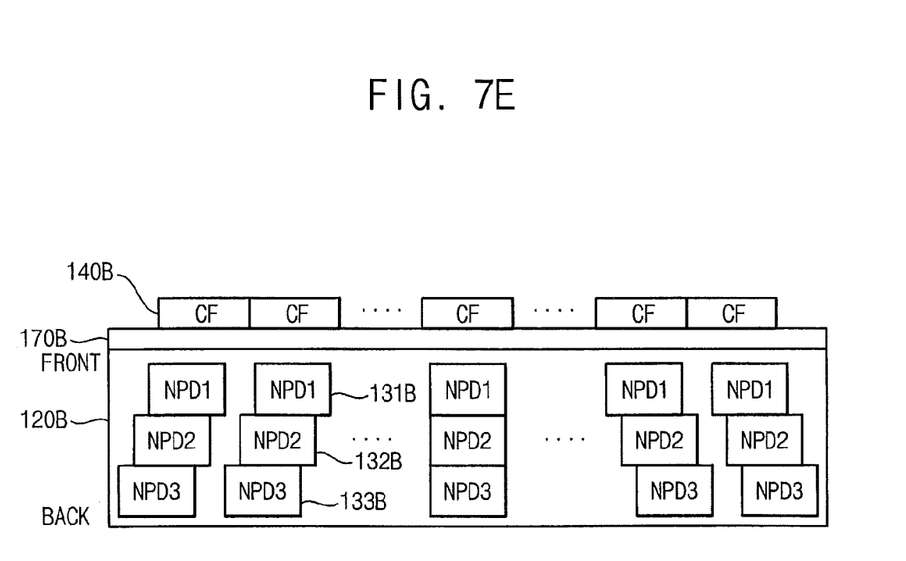

Referring to FIG. 7E, the color filters 140B may be formed on the insulation layer 170B in the slope direction based on the slope angle of the light. Each of the color filters 140B passes the light having a different wavelength range according to types of the color filters 140B (e.g., the blue filter B, the green filter G, and the red filter R). In an exemplary embodiment, the color filters 140B may be formed above the unit pixels 130B while maintaining the slope direction in which the first through third doping regions 131B, 132B, and 133B of the unit pixels 130B are laminated. As described above, the color filters 140B may include sets of the red filter R, the green filter G, and the blue filter B, or sets of the yellow filter Y, a magenta filter M, and a cyan filter C. The color filters 140B may be formed by coating the insulation layer 170B with a photosensitive material (e.g., a photo-resist), and by patterning the photosensitivity material (e.g., performing the photolithography and lithography process using masks). In an exemplary embodiment, a flat layer (i.e., an over-coating layer) may be coated on the color filters 140B.

Figure 7F:
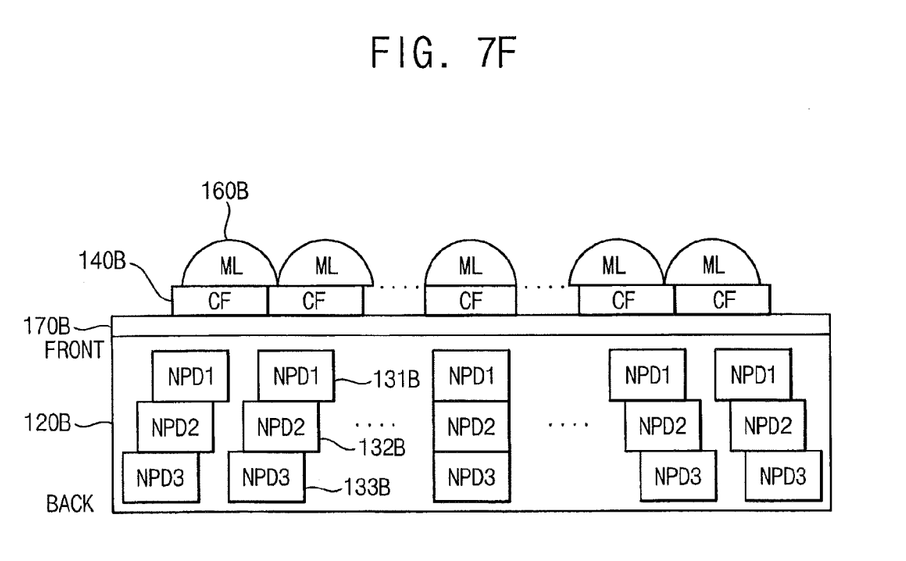

Referring to FIG. 7F, the micro lenses 160B may be formed on the color filters 140B in the slope direction based on the slope angle of the light. For example, the micro lenses 160B may be formed above the unit pixels 130B while maintaining the slope direction in which the first through third doping regions 131B, 132B, and 133B of the unit pixels 130B are laminated. In an exemplary embodiment, the micro lenses 160B may be formed by generating a plurality of patterns using a beam penetration photo-resist, and by performing a reflow process for the plurality of patterns. Since the manufacturing process of the CMOS image sensor 100B illustrated in FIGS. 7A through 7F is an exemplary embodiment, the manufacturing process of the CMOS image sensor 100B is not limited thereto.

As described above, a unit pixel according to some example embodiments includes a photodiode having a slope shape to improve spectral characteristics such that an optical crosstalk due to incident light may be efficiently prevented. In addition, a CMOS image sensor according to some example embodiments may efficiently prevent an optical crosstalk due to incident light by laminating unit pixels, color filters, and micro lenses in a slope direction of incident angle of light. Thus, the present inventive concept may be applied to an electric device such as a computer, a digital camera, a cellular phone, a personal digital assistant (PDA), a scanner, a navigation system, a video phone, an auto-focusing system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A CMOS image sensor, comprising:
a semiconductor substrate having a plurality of unit pixels, each of the unit pixels including a photodiode that has a slope shape based on an incident angle of light;
a plurality of color filters laminated above the unit pixels in a slope direction based on the incident angle of the light; and
a plurality of micro-lenses laminated on the color filters in the slope direction based on the incident angle of the light.

2. The CMOS image sensor of claim 1, the photodiode includes a plurality of doping regions, the doping regions being laminated in the slope direction based on the incident angle of the light.

3. The CMOS image sensor of claim 2, wherein the doping regions of the photodiode in the unit pixel arranged on an edge portion of an image sensor pixel array are laminated in a greater slope direction compared to the doping regions of the photodiode in the unit pixel arranged on a center portion of the image sensor pixel array.

4. The CMOS image sensor of claim 3, wherein the CMOS image sensor employs a bayer pattern technique.

5. The CMOS image sensor of claim 4, wherein the color filters include a red filter, a green filter, and a blue filter.

6. The CMOS image sensor of claim 4, wherein the color filters include a yellow filter, a magenta filter, and a cyan filter.

7. The CMOS image sensor of claim 2, wherein the CMOS image sensor is a back-illuminated image sensor that generates image data based on the light illuminating on a back side of the semiconductor substrate.

8. The CMOS image sensor of claim 7, wherein the color filters and the micro-lenses are laminated in a back side direction of the semiconductor substrate.

9. The CMOS image sensor of claim 8, wherein the photodiode comprises:
a first doping region formed in the semiconductor substrate;
a second doping region formed above the first doping region in the slope direction based on the incident angle of the light; and
a third doping region formed above the second doping region in the slope direction based on the incident angle of the light.

10. The CMOS image sensor of claim 9, wherein the first doping region is a (n−)-type doping region, the second doping region is a (n−)-type doping region, and the third doping region is a (n+)-type doping region.

11. The CMOS image sensor of claim 2, wherein the CMOS image sensor is a front-illuminated image sensor that generates image data based on the light illuminating on a front side of the semiconductor substrate.

12. The CMOS image sensor of claim 11, wherein the color filters and the micro-lenses are laminated in a front side direction of the semiconductor substrate.

13. The CMOS image sensor of claim 12, wherein the photodiode comprises:
a first doping region formed in the semiconductor substrate;
a second doping region formed below the first doping region in the slope direction based on the incident angle of the light; and
a third doping region formed below the second doping region in the slope direction based on the incident angle of the light.

14. The CMOS image sensor of claim 13, wherein the first doping region is a (n−)-type doping region, the second doping region is a (n−)-type doping region, and the third doping region is a (n+)-type doping region.

* * * * *